United States Patent
Popescu (10) Patent No.: US 9,035,650 B2
(45) Date of Patent: May 19, 2015

(54) MAGNETIC RESONANCE METHOD AND SYSTEM TO GENERATE MR IMAGE DATA WITH PARALLEL SLICE EXCITATION

(75) Inventor: Stefan Popescu, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 835 days.

(21) Appl. No.: 13/239,670

(22) Filed: Sep. 22, 2011

(65) Prior Publication Data

US 2012/0068704 A1 Mar. 22, 2012

(30) Foreign Application Priority Data

Sep. 22, 2010 (DE) .......................... 10 2010 041 191

(51) Int. Cl.
| | |
|---|---|
| *G01R 33/54* | (2006.01) |
| *G01R 33/36* | (2006.01) |
| *G01R 33/561* | (2006.01) |
| *G01R 33/483* | (2006.01) |
| *G01R 33/3415* | (2006.01) |

(52) U.S. Cl.
CPC ........ *G01R 33/5611* (2013.01); *G01R 33/4835* (2013.01); *G01R 33/3415* (2013.01)

(58) Field of Classification Search
CPC ....................... G01R 33/4835; G01R 33/5611
USPC ................................................... 324/307, 309
See application file for complete search history.

(56) References Cited

U.S. PATENT DOCUMENTS

| | | | | |
|---|---|---|---|---|
| 5,422,572 | A * | 6/1995 | Yao | 324/309 |
| 6,614,225 | B1 * | 9/2003 | Feinberg | 324/307 |
| 7,034,530 | B2 | 4/2006 | Ahluwalia et al. | |
| 7,583,780 | B2 * | 9/2009 | Hsieh et al. | 378/4 |
| 7,622,925 | B2 | 11/2009 | Fujimoto et al. | |
| 7,741,842 | B2 | 6/2010 | McKenzie et al. | |
| 8,710,839 | B2 | 4/2014 | Constable et al. | |
| 2006/0049829 | A1 * | 3/2006 | Takizawa et al. | 324/318 |

OTHER PUBLICATIONS

Larkman et al.: "Use of Multicoil Arrays for Separation of Signal from Multiple Slices Simultaneously Excited," in: Journal of Magnetic Resonance Imaging 13:313-317 (2001).

(Continued)

*Primary Examiner* — Melissa Koval
*Assistant Examiner* — Rishi Patel
(74) *Attorney, Agent, or Firm* — Schiff Hardin LLP (57) ABSTRACT

In a method and a magnetic resonance (MR) system and method to generate MR image data of a predetermined volume segment within an examination subject, multiple slices of the volume segment are simultaneously excited by at least one RF excitation pulse, and during the excitation a slice selection gradient is switched. The measurement signals from the multiple slices are acquired with multiple RF reception antennas, at least some of which are spaced along the propagation direction of the slice selection gradient. During the acquisition of the measurement signals the slice selection gradient is switched in order to achieve a spectral separation of the measurement signals of different slices. The MR image data are generated from the measurement signals.

12 Claims, 7 Drawing Sheets

(56) References Cited

OTHER PUBLICATIONS

Moeller et al: "fMRI with 16 fold reduction using multibanded Multislice sampleing," in: Proc. Intl. Soc. Mag. Reson. Med. 16; p. 2366 (2008).

Hargreaves, et al.: "Variable-Rate Selective Excitation for Rapid MRI Sequences," in: Magnetic Resonance in Medicine 52:590-597 (2004).

Weaver: "Simultaneous Multislice Acquisition of MR Images," in: Magn. Reson. in Medicine 8, 275-284 (1988).

* cited by examiner

MAGNETIC RESONANCE METHOD AND SYSTEM TO GENERATE MR IMAGE DATA WITH PARALLEL SLICE EXCITATION

BACKGROUND OF THE INVENTION

1. Field of the Invention

The present invention concerns a method and system in which multiple slices of a subject are excited simultaneously or in parallel in order to generate MR image data for these slices.

2. Description of the Prior Art

U.S. Pat. No. 7,034,530 B2 describes a method in which respectively only a single slice is excited or read out at a given point in time. However, in order to implement the method as quickly as possible MR sequences for different slices are executed interleaved in successive time intervals, whereby overlapping relaxation times and echo times of the respective slices occur. However, this method does not operate to acquire slices in parallel.

U.S. Pat. No. 7,622,925 B2 and U.S. Pat. No. 7,741,842 B2 each describe an accelerated parallel readout technique, wherein in spite of incomplete scanning of k-space the entire data set in k-space is reconstructed by the use of multiple RF acquisition coils.

An additional possibility known for the acceleration of the generation of MR image data is to scan multiple slices simultaneously in a single or, respectively, common excitation and readout step. This method corresponds to an analogous method in computer tomography (CT) in which multiple slices are likewise acquired simultaneously.

Figure 1:
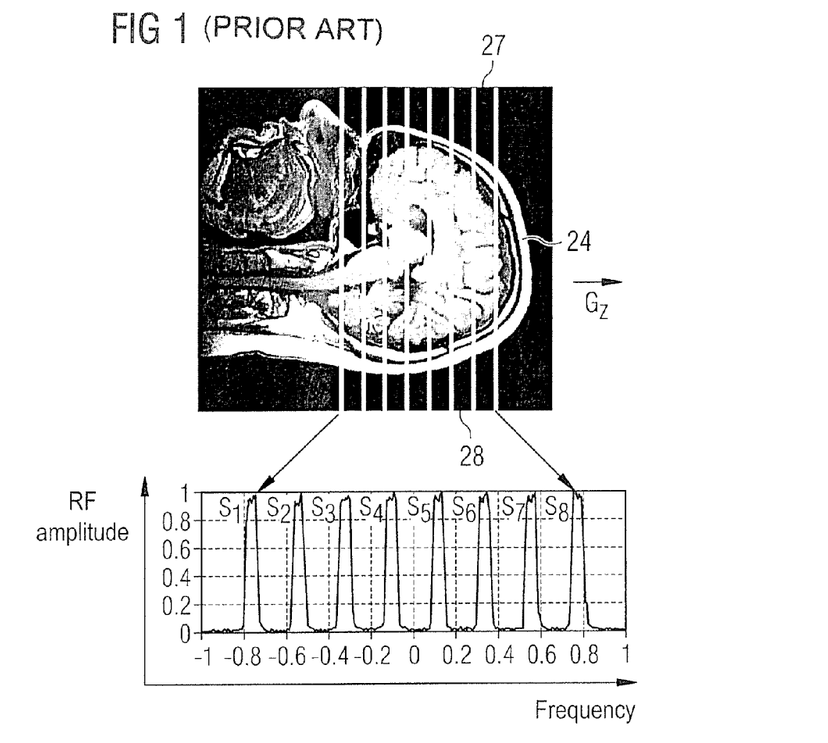
FIG. 1 shows how multiple slices are excited simultaneously according to the prior art.

In the corresponding MR method, given a switched linear gradient ($G_Z$) a single RF pulse is radiated along the direction of the slice stack in a predetermined of segment 24, whereby RF energy is applied simultaneously across multiple frequency bands in order to excite the spins in multiple parallel slices at the same time (as is shown in FIG. 1). The RF amplitude of the RF pulse is also shown over the frequency in FIG. 1, whereby eight slices S1 through S8 are selectively excited simultaneously.

However, in this method the problem occurs that the echo signals of the different slices overlap both in the time range and in the frequency range, so it is necessary to eliminate the aliasing that occurs.

For this the methods of Multiband GRAPPA ("Use of Multicoil Arrays for Separation of Signal from Multiple Slices Simultaneously Excited", D. J. Larkman et al., Journal of Magnetic Resonance Imaging 13; Pages 313-317, 2001) and Wideband MRI ("Simultaneous multislice imaging with slice-multiplexed RF pulses", J. B. Weaver, Magnetic Resonance in Medicine 8, Pages 275-284, 1988) are known according to the prior art.

Figure 2:
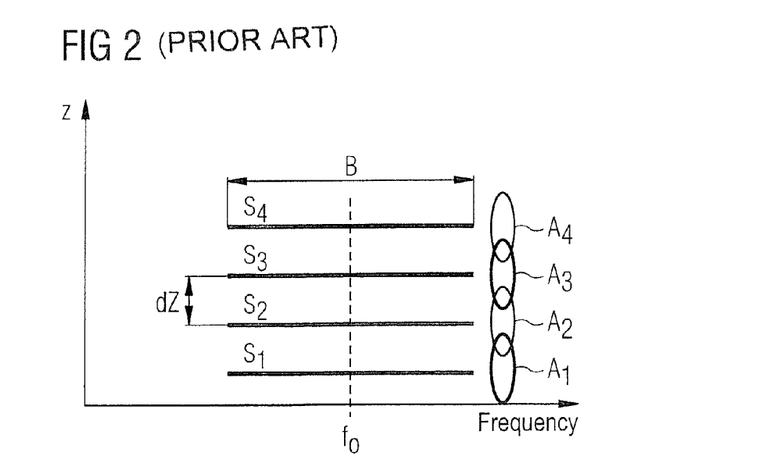
FIG. 2 shows an arrangement of multiple RF reception antennas for simultaneous acquisition of measurement signals of multiple slices according to the prior art.

In GRAPPA the slices S1-S4 that are to be acquired simultaneously are arranged spatially separately from one another such that the signals from the respective slice can thereby be separated from the signals of the other slices in that an RF reception antenna $A_1$-$A_4$ associated with the respective slice $S_1$-$S_4$ is used (as is shown in FIG. 2). Signals in the same frequency band are in fact acquired from the different slices $S_1$-$S_4$ during the readout of the signals from said different slices $S_1$-$S_4$. However, since the slice interval dZ between two adjacent slices in cooperation with the sensitivity profiles of the RF antennas $A_1$-$A_4$ is sufficiently large, it is ensured that the respective antenna $A_1$-$A_4$ essentially detects only the signals of the slice $S_1$-$S_4$ associated with it.

A disadvantage of GRAPPA is that the interval between the adjacent slices $S_1$ through $S_4$ is relatively large, such that the number of slices that are to be acquired simultaneously is relatively low (3) given the imaging of a human heart, for example. Downsizing the RF antennas would not solve this problem since, although the spatial sensitivity of the antenna then would be improved, only a small volume in immediate proximity to the smaller RF antenna would be acquired, such that portions in the middle of the slice (and therefore further distant from the corresponding RF antenna) could only be insufficiently acquired by the RF antenna.

While GRAPPA operates with a spatial separation of the slices $S_1$ through $S_4$ to be acquired, the method according to Weaver operates with a spectral separation of the slices $S_1$ through $S_4$ to be acquired. During the readout a second gradient coding the frequency (slice selection gradient) along the direction of the slice stack is switched simultaneously and perpendicular to the gradient coding the frequency (which gradient is also normally present). The signals of the slices to be acquired are thereby separated into different frequency bands (as is shown in FIG. 3).

Figure 3:
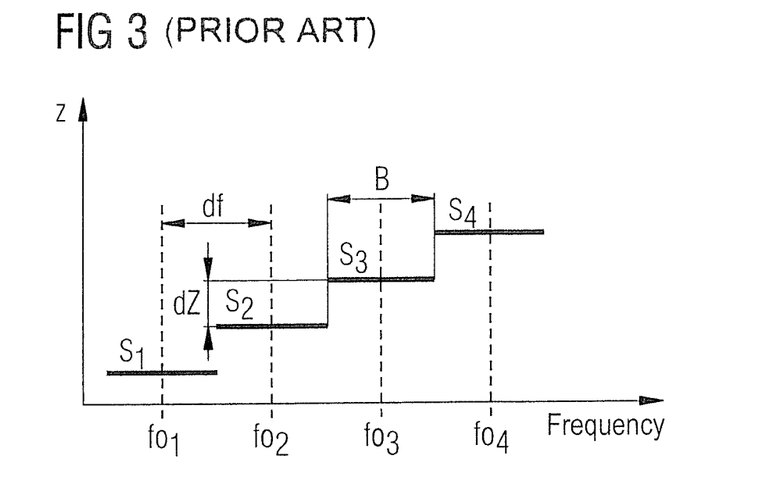
FIG. 3 schematically shows how the bandwidth of the slices to be acquired shifts along the z-axis according to the known method according to Weaver.

It is apparent in FIG. 3 that the frequency bands B of the individual slices $S_1$-$S_4$ do not overlap. This is also necessary (i.e. the frequency interval df between two adjacent slices must be correspondingly large) so that the measurement signals can be associated with the respective slice upon readout. So that the frequency interval df between two adjacent slices is sufficiently large, given a predetermined strength of the slice selection gradients and the frequency coding gradients the slice interval dZ must be selected to be correspondingly large.

The problem in the method according to Weaver is that the slice selection gradient and the readout gradient ("readout") are simultaneously active upon readout. Two gradients coding the frequency are thereby simultaneously active, which disadvantageously leads to the situation that what is known as the pixel sensitivity profile is tilted proportional to the ratio of the strengths of the two gradients. In order to avoid a blurring of the image to be created, this ratio should be smaller than 1, which corresponds to a flip angle of 45°. (This means that the slice selection gradient should not be stronger than the readout gradient.) Moreover, the method from Weaver is limited by the maximum strength of gradient fields that is to be achieved. In practice this leads to the situation that three slices can be acquired simultaneously in acquisitions of the human head, and at most four slices can be acquired simultaneously in acquisitions of the human thorax or of human extremities. Given the acquisition of the human heart wherein the volume segment to be acquired typically extends across 12-15 cm in the slice stack direction, at most only two slices can be acquired simultaneously with the method by Weaver.

SUMMARY OF THE INVENTION

An object of the present invention is to acquire data from more slices simultaneously, specifically in the case of acquisition of slices of the human heart, than is possible according to the current state of the art.

Within the scope of the present invention, a method is provided to generate MR image data of a predetermined volume segment within an examination subject by means of a magnetic resonance system. The method according to the invention includes the following steps:

Simultaneous acquisition of multiple slices of the predetermined volume segment with one or with more RF excitation pulses that excite (Flip) nuclear spins in a subject. A slice selection gradient is switched (activated) during the excitation.

Acquisition of measurement signals (MR signals arising from the processing nuclear spins after excitation) from the multiple slices with multiple RF reception antennas which are at least partially spaced along the propagation direction of the slice selection gradient, i.e. parallel to the surface normal of the slices. During the acquisition of the measurement signals the slice selection gradient is switched in order to achieve a partial spectral separation of the measurement signals from the different slices.

The MR image data (the MR images) are created by means of the measurement signals.

The fact that the RF reception antennas are spaced at least partially along the propagation direction of the slice selection gradient (i.e. parallel to the slice thickness direction or slice stack direction) allows room for multiple embodiments. For example, all RF reception antennas can be arranged at respective different points along the propagation direction of the slice selection gradient in order to receive respective signals of a slice associated with the respective RF reception antenna, for example. However, it is also possible that a defined number (two or four, for example) of RF reception antennas is present at the same point along the propagation direction of the slice selection gradient, and that these spaced apart from a different two or four RF reception antennas in the propagation direction of the slice selection gradient, etc.

The strength of the slice selection gradient upon excitation of the slices does not need to coincide with the strength of the slice selection gradient at the acquisition of the measurement signals from the multiple slices.

The present invention essentially combines the spatially separate acquisition of the measurement signals of different slices via the use of multiple spatially separate RF reception antennas with the spectral separation of the measurement signals from the different slices. The spacing of the slices to be acquired simultaneously can advantageously be reduced relative to the prior art, in spite of an advantageous pixel sensitivity profile. The additional separation of the frequencies with which the spins of the different slices precess advantageously reduces the requirements with regard to the spatial sensitivity of the RF reception antennas and thereby reduces noise due to an overlapping of the RF reception antennas (known as the g-factor). Up to nine slices can be acquired in parallel (simultaneously) according to the invention.

In the acquisition of the measurement signals of the multiple slices, a frequency coding gradient is in particular switched simultaneously with the slice selection gradient.

According to a preferred embodiment according to the invention, the respective RF reception antennas are matched to a frequency band that corresponds to frequencies of spins in the readout that are located in those slices or in that slice which lie next to or nearest to the respective RF reception antenna.

If the RF reception antennas are situated at different points along the propagation direction of the slice selection gradient, it is advantageous if a specific number of RF reception antennas is arranged at different points along the propagation direction of the slice selection gradient. For example, a first RF reception antenna can be arranged at each point on a first side of the volume segment and a second RF reception antenna can be arranged on a second side of the volume segment so that these two RE reception antennas are situated opposite one another in parallel. In this case the first RF reception antenna essentially receives signals from the halves of the slices (said slices being associated with the two RF reception antennas) that are situated in proximity to the first RF reception antenna. In contrast to this, the second RF reception antenna essentially receives signals from the other halves of these associated slices which are adjacent to the second RF reception antenna. Naturally, according to the invention it is also possible that an arbitrarily different number of RF reception antennas (4, for example) are arranged at the same point along the propagation direction of the slice selection gradient. The RF reception antennas arranged at the same point along the propagation direction of the slice selection gradient are thereby in particular arranged with the same angle interval around the slices associated with these RF reception antennas so that each of these RF reception antennas receives measurement signals of a different segment of the associated slices.

In order to use accelerated parallel readout techniques it is advantageous if, at each point along the propagation direction of the slice selection gradient, a third RF reception antenna is arranged on a third side of the volume segment and a fourth RF reception antenna is arranged on a fourth side of the volume segment, wherein the third side is situated parallel to the fourth side. The surface normal of the third side and the surface normal of the fourth side are thereby parallel to the propagation direction of the phase coding gradient. Given acquisition of the measurement signals, the complete data set is not acquired in k-space in the propagation direction of the phase coding gradient; rather, only every n-th (n>1, for example 2nd or 3rd) k-space line (along the kx-axis of k-space) is acquired.

Since the variation of the sensitivity profiles of the third RF reception antenna and the fourth RF reception antenna is maximal precisely along the phase coding direction (propagation direction of the phase coding gradient), meaning that the sensitivity profiles of the third RF reception antenna and the fourth RF reception antenna differ nearly exclusively along the phase coding direction while they are nearly identical along the other directions, the third and the fourth RF reception antenna are optimally suitable for the accelerated parallel readout technique.

It is advantageous for one of the RF reception antennas, among those that are arranged at the same point along the propagation direction of the slice selection gradient, to be matched (tuned) to a frequency band that corresponds to frequencies of spins in the acquisition of the measurement signals that are present in slices associated with those segments at which the respective RF reception antenna is arranged.

According to a further embodiment of the invention, the MR image data are reconstructed from the acquired measurement signals with the use of an iterative, statistical reconstruction method. The reconstruction method implements a non-linear optimization in order to minimize a cost function which indicates a measure of a mismatch of the measurement signals to the MR image data to be reconstructed.

For example, a nonlinear optimization is described in U.S. Pat. No. 7,583,780 B2 wherein a cost function is minimized in order to reduce the L2 norm of a term which represents a measure of the mismatch of the measurement signals to the MR image data. According to the invention, such an iterative reconstruction method which is known for CT according to the prior art is used for MR imaging.

The iterative reconstruction method which known from "Image Reconstruction by Regularized Nonlinear Inversion—Joint Estimation of Coil Sensitivities and Image Content", Uecker et al., Magnetic Resonance in Medicine MRM, 60, Pages 674-682, 2008 can also be used within the scope of the present invention.

According to the invention it is also possible that the simultaneous excitation of the slices is executed with a modified signal form of the RF excitation pulse combined with a signal form of the slice selection gradient that changes over time.

Such a combination from an RF excitation pulse modified with regard to its signal form and a slice selection gradient varying over time can lead to the same excitation profile of the slices as a normal RF excitation pulse combined with a temporally constant slice selection gradient. The advantage of the modified RF excitation pulse and the temporally varying slice selection gradient lies in the lower peak RF power (the requirement for power amplifiers of the magnetic resonance system is thereby less) and therefore also in a reduced (maximum) radiation exposure of the patient.

VERSE ("Variable-Rate Selective Excitation"; see "Variable-Rate Selective Excitation for Rapid MRI Sequences", B. A. Hargreaves et al., Magnetic Resonance in Medicine 52, Pages 590-597, 2004) is such a method in which a slice selection gradient varying over time is used in order to modify the shape of the RF pulse without simultaneously changing the spatial excitation profile for the slices.

According to the invention it is also possible that a bundle of RF excitation pulses is used instead of only one RD excitation pulse, wherein each RE excitation pulse of this pulse bundle excites one of the multiple slices.

With the use of a bundle of RE excitation pulses, the peak RF power that is necessary to generate the RF excitation and the radiation exposure for the patient can also be decreased relative to the use of only one RF excitation pulse.

Within the scope of the present invention, a magnetic resonance system is also provided to generate MR image data of a predetermined volume segment within an examination subject. The magnetic resonance system has a basic field magnet, a gradient field system, multiple RF antennas and a control device with which the gradient field system and the RF antennas are controlled. Measurement signals which have been acquired by the RF antennas are received are evaluated and MR image data are generated therefrom. The RF antennas are at least partially spaced along the propagation direction of the slice selection gradient. The magnetic resonance system is in the position to excite multiple slices of the volume segment simultaneously with one RF excitation pulse or with multiple RF excitation pulses, wherein the magnetic resonance system simultaneously switches the slice selection gradient. The magnetic resonance system acquires the measurement signals of the multiple slices with the RF antennas, wherein the magnetic resonance system switches the slice selection gradient during the acquisition of these measurement signals in order to achieve a spectral separation of the measurement signals from different slices. The magnetic resonance system subsequently generates the MR image data depending on the measurement signals.

The advantages of the magnetic resonance system according to the invention essentially correspond to the advantages of the method according to the invention.

Furthermore, the present invention encompasses a non-transitory, computer-readable storage medium encoded with control commands (a computer program or software), which can be loaded into a memory of a programmable controller or a computer of a magnetic resonance system. All or various embodiments of the method according to the invention that are described in the preceding can be executed when the computer program runs in the controller or control device of the magnetic resonance system. The program commands may possibly require program means (libraries and auxiliary functions, for example) in order to realize the corresponding embodiment of the method. The software can be a source code (C++, for example) that must still be compiled (translated) and linked or that only must be interpreted, or can be an executable software code that has only to be loaded into the corresponding computer for execution.

The data storage medium can be a DVD, a magnetic tape or a USB stick.

The present invention is in particular suitable for an MR imaging of the human heart. Since the heart beats continuously and therefore only a brief time window of low activity in the diastole is present, it is relatively difficult to acquire the heart fast enough by means of an MR method in order to nevertheless avoid movement artifacts and show the cardiac arteries (which are approximately 1 mm thin) sharp enough. However, in that according to the invention up to 9 slices can be acquired in parallel, the method according to the invention operates fast enough to create MR images of the heart fast enough at sufficient quality.

Naturally, however, the present invention is not limited to this preferred field of application since the present invention can be used with any body regions of a patient. Moreover, the present invention is also suitable for the imaging of volume segments of any organism or inanimate material.

DESCRIPTION OF THE PREFERRED EMBODIMENTS

Figure 4:
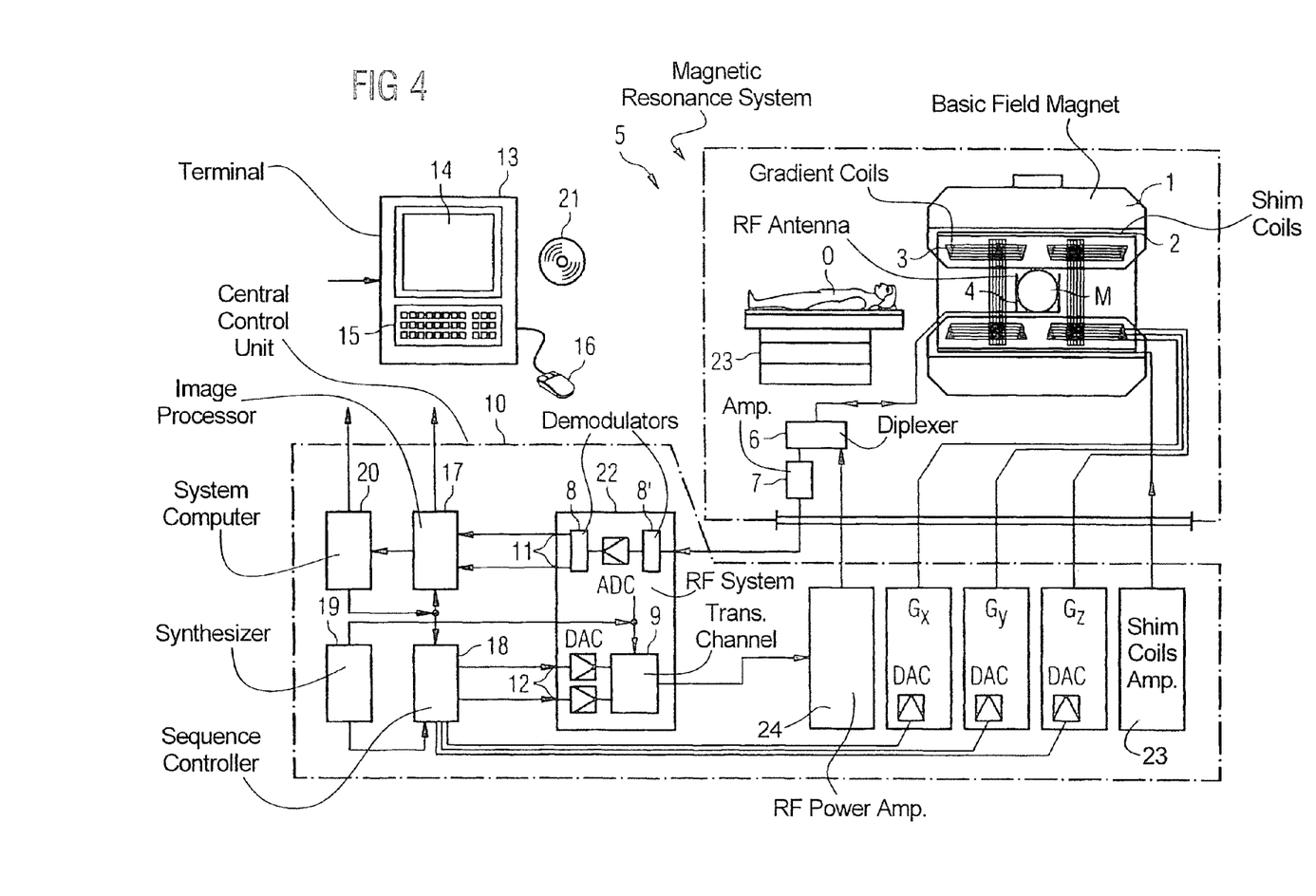
FIG. 4 schematically illustrates a magnetic resonance system according to the invention.

FIG. 4 is a schematic depiction of a magnetic resonance system 5 (a magnetic resonance imaging or magnetic resonance tomography apparatus). A basic field magnet 1 generates a temporally constant, strong magnetic field for polarization or, respectively, alignment of the nuclear spins in an examination region of a subject O, for example of a part of a human body that is to be examined, which body lies on a table 23 and is slid into the magnetic resonance system 5. The high homogeneity of the basic magnetic field that is required for the nuclear magnetic resonance measurement is defined in a typically spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2 if necessary, which are operated by a shim coils amplifier 23.

A cylindrical gradient coil system 3 composed of three sub-windings is used in the basic field magnet 1. Each sub-winding is supplied with current by a corresponding amplifier to generate a linear gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier has a digital-analog converter that is activated by a sequence controller 18 for time-accurate generation of gradient pulses.

One or more radio-frequency antennas 4 that convert the radio-frequency pulses emitted by a radio-frequency power amplifier into an alternating magnetic field for excitation of the nuclei and alignment of the nuclear spins of the subject O to be examined, or a region of the subject O that is to be examined, is located within the gradient field system 3. Each radio-frequency antenna 4 has one or more RF transmission coils and multiple RF reception coils or RF reception antennas in the form of an annular (advantageously linear or matrix-like) arrangement. The alternating field emanating from the precessing nuclear spins—i.e. normally the nuclear spin echo signals caused by a pulse sequence composed of one or more radio-frequency pulses and one or more gradient pulses—is also converted by the RF reception coils of the respective RF antenna into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller as a series of complex numbers. This number sequence is supplied as a real part and imaginary part to a digital-analog converter in the radio-frequency system 22 via respective inputs 12 and from the digital-analog converter 22 to a transmission channel 9. In the transmission channel 9 the pulse sequences are modulated on a radio-frequency carrier signal whose base frequency corresponds to the resonance frequency of the nuclear spins in the measurement volume.

The switching from transmission operation to reception operation takes place via a transmission/reception diplexer 6. Signals representing the radio-frequency pulses are supplied to the radio-frequency antenna(s) from a radio-frequency power amplifier 24. The RF transmission coil of the radio-frequency antenna(s) 4 radiate(s) the radio-frequency pulses for excitation of the nuclear spins into the measurement volume M, and resulting echo signals are scanned (detected) by the RF reception coils. The acquired nuclear magnetic resonance signals are phase-sensitively demodulated on an intermediate frequency in a reception channel 8' (first demodulator) of the radio-frequency system 22 and digitized in an analog-digital converter (ADC). This signal is further demodulated on a frequency of zero. The demodulation on the frequency of 0 and the separation into real part and imaginary part occur in a second demodulator 8 after the digitization in the digital domain. An MR image is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 thereby controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image and the presentation of the generated MR image take place via a terminal 13 that has a keyboard 15, a mouse 16 and a monitor 14.

Figure 5:
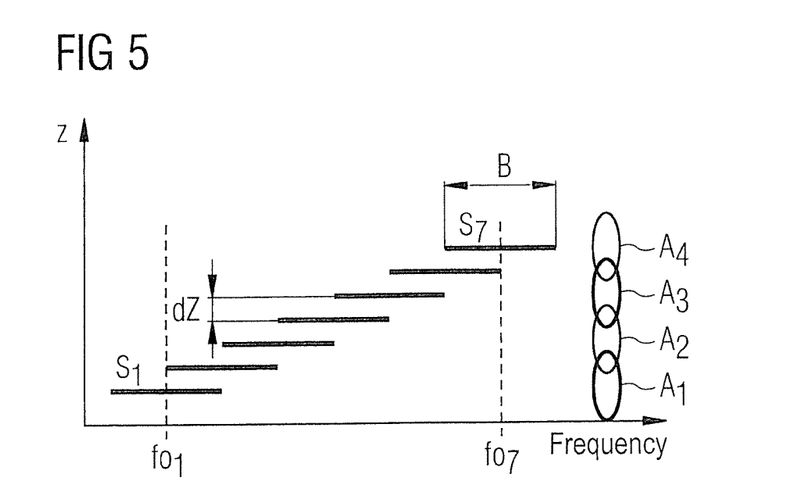
FIG. 5 schematically shows how the bandwidth of the slices to be acquired shifts along the z-axis according to the invention.

A preferred embodiment according to the invention is presented in FIG. 5, wherein the slice selection gradient $G_z$ is activated during the readout period, whereby a 50-percent overlap of the slices $S_1$-$S_7$ in the frequency range is enabled. RF reception antennas (coils) $A_1$-$A_4$ matched (with regard to their sensitivity profiles) to the corresponding slices $S_1$-$S_7$ are used for this in order to avoid an aliasing.

It is apparent that the bandwidth of each slice $S_1$-$S_7$ covers the bandwidth B of the respective adjacent slice by 50% or, respectively, leaves it 50% uncovered. In comparison to the prior art (see FIG. 3), the slice interval dZ can thereby be at least halved.

Since the method according to Weaver (FIG. 3) does not provide any spatial separation of the measurement signals of the different slices (by means of multiple spatially separated RF reception antennas $A_1$-$A_4$), in the method according to Weaver no overlapping of the bandwidths B of adjacent slices may occur. In other words, the slice interval dZ in FIG. 3 (method according to Weaver) must be chosen to be at least twice as large as the slice interval dZ in the method according to the invention in FIG. 5.

The spectral separation of the measurement signals of adjacent slices can also be used to reduce the requirements with regard to the spatially selective sensitivity of the RF reception antennas A1-A4, whereby the noise image is improved based on an overlapping of adjacent RF reception antennas (g-factor) in comparison to the prior art.

Figure 6:
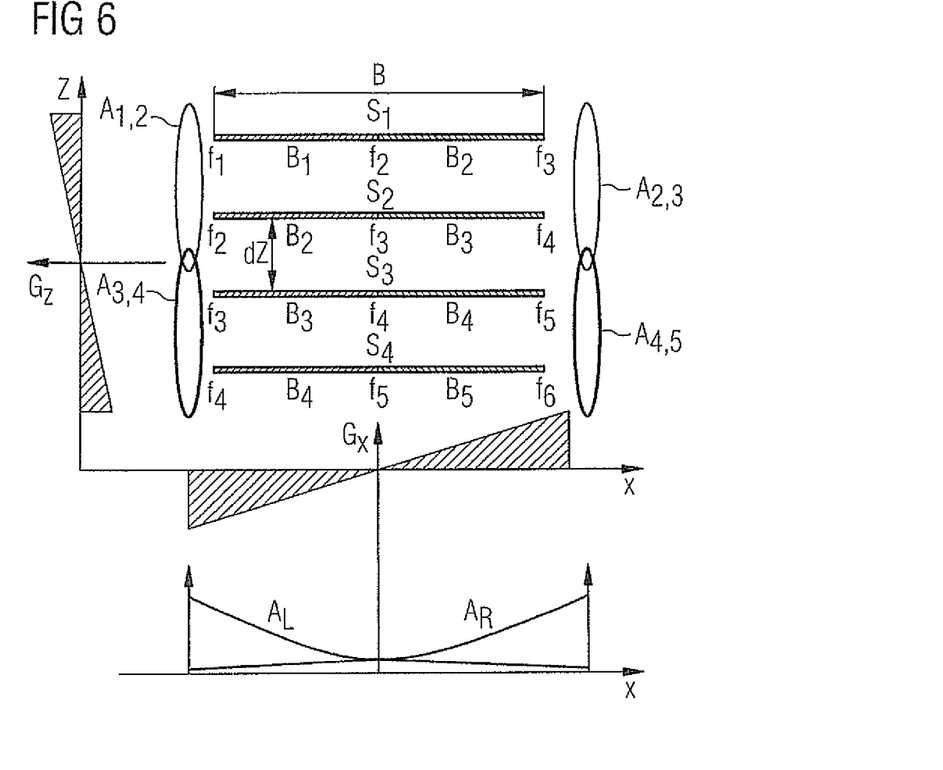
FIG. 6 schematically illustrates why the present invention enables a smaller slice interval.

An additional embodiment according to the invention is shown in FIG. 6. In comparison to the embodiment shown in FIG. 5, the RF reception antennas are arranged on different sides 27, 28 (see FIG. 1) of the volume segment 24 to be acquired.

During the readout the slice selection gradient $G_z$ and the gradient $G_x$ coding the frequency in the slice plane are active. The gradient $G_x$ ensures that the frequency of the spins in each slice changes along the x-axis in the respective slice plane. For example, the slice S1 thereby has at its left half (x<0) a frequency band B1 which spans the frequencies $f_1$ through $f_2$. In contrast to this, the right half (x>0) of the slice $S_1$ has a frequency band B2 which spans the frequencies $f_2$ through $f_3$. The gradient $G_z$ switched simultaneously with the gradient $G_x$ ensures that the frequency of the spins changes from slice to slice (along the z-axis). Overlapping points in two adjacent slices are thereby respectively spaced apart from one another by this same frequency difference df.

The RF reception antennas with which an aliasing due to the (in this case 50 percent) overlap of the frequency bands of adjacent slices should be prevented are arranged spaced apart from one another in the direction of the z-axis, wherein two respective RF reception antennas are however arranged with the same z-coordinate on different sides 27, 28 of the volume segment 24. The sensitivity profiles of the RF reception antennas are shown in FIG. 6. $A_L$ thereby designates the sensitivity profile for the RE reception antennas $A_{1,2}$, $A_{3,4}$ on the left side 27 of the volume segment 24 and $A_R$ designates the sensitivity profile for the RF reception antennas $A_{2,3}$, $A_{4,5}$ on the right side 28 of the volume segment 24.

For example, the RF reception antenna $A_{2,3}$ is tuned or optimized such that it optimally receives the signals in the frequency bands $B_2$ and $B_3$ from the right halves of the slices $S_1$ and $S_2$. Due to the sensitivity profile $A_R$ the RF reception antenna $A_{2,3}$ is essentially insensitive for the signals in the frequency bands $B_2$ and $B_3$ from the left halves of the slices $S_2$ and $S_3$. It should be noted that the signals in the middle of the respective slices $S_1$-$S_4$ where the RF reception antennas on the right side and the left side are equally sensitive are best separated in the frequency range.

Figure 7:
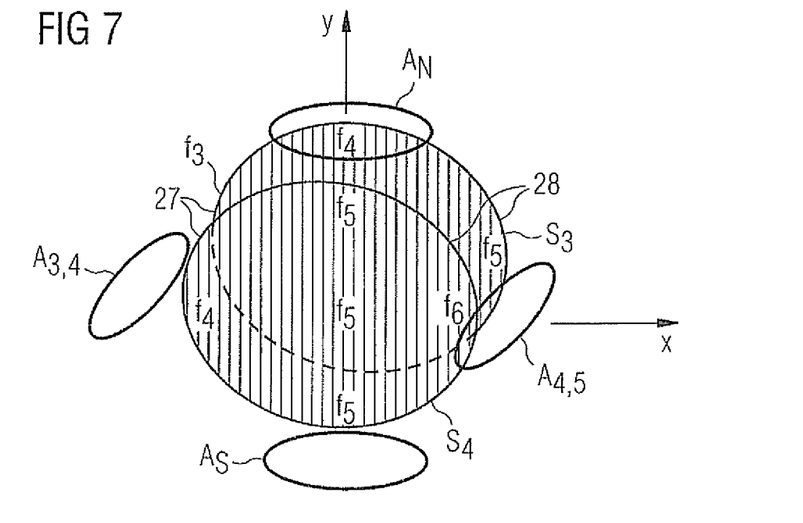
FIG. 7 shows an arrangement of four RF reception antennas according to the invention for the acquisition of two adjacent slices.

An additional embodiment according to the invention is shown in FIG. 7. In this embodiment—in comparison to the embodiment shown in FIG. 6—four RF reception antennas are arranged around the volume segment at the same z-coordinate. In other words, in addition to the RF reception antennas $A_{3,4}$ and $A_{4,5}$ two additional RF reception antennas $A_N$, $A_S$ are arranged above and below (i.e. along the y-axis). Since the two additional RF reception antennas $A_N$, $A_S$ are arranged at the same x-coordinate and at the same z-coordinate and differ only with regard to their y-coordinate, they are matched to the same bandwidth which spans from $f_4$ to $f_5$ since the frequencies of the spins do not change along the y-axis within the same slice $S_3$, $S_4$. Given the embodiment shown in FIG. 7, the left RF reception antenna $A_{3,4}$ accordingly receives the signals in the left middle region of the slices $S_3$, $S_4$, the upper RF reception antenna $A_N$ receives the signals in the upper middle region of the slices $S_3$, $S_4$, the right RF reception antenna $A_{4,5}$ receives the signals in the right middle region of the slices $S_3$, $S_4$ and the lower RF reception antenna $A_S$ receives the signals in the lower middle region of the slices $S_3$, $S_4$.

Due to their different antenna sensitivity with regard to the y-axis, the RF reception antennas $A_N$ and $A_S$ in particular abet the use of accelerated parallel readout techniques (PAT, "Parallel Acquisition Technique"). For example, in the accelerated parallel readout techniques the complete data set in k-space is not acquired in the phase coding direction (along the y-axis) in order to thereby save readout time. Due to their different position with regard to the y-coordinate, the RF reception antennas $A_N$ and $A_S$ (together with the other RF reception antennas $A_{3,4}$ and $A_{4,5}$) are optimally suitable for use in the accelerated parallel readout technique in order to also acquire the entire data set in k-space with the accelerated parallel readout technique.

Figure 8:
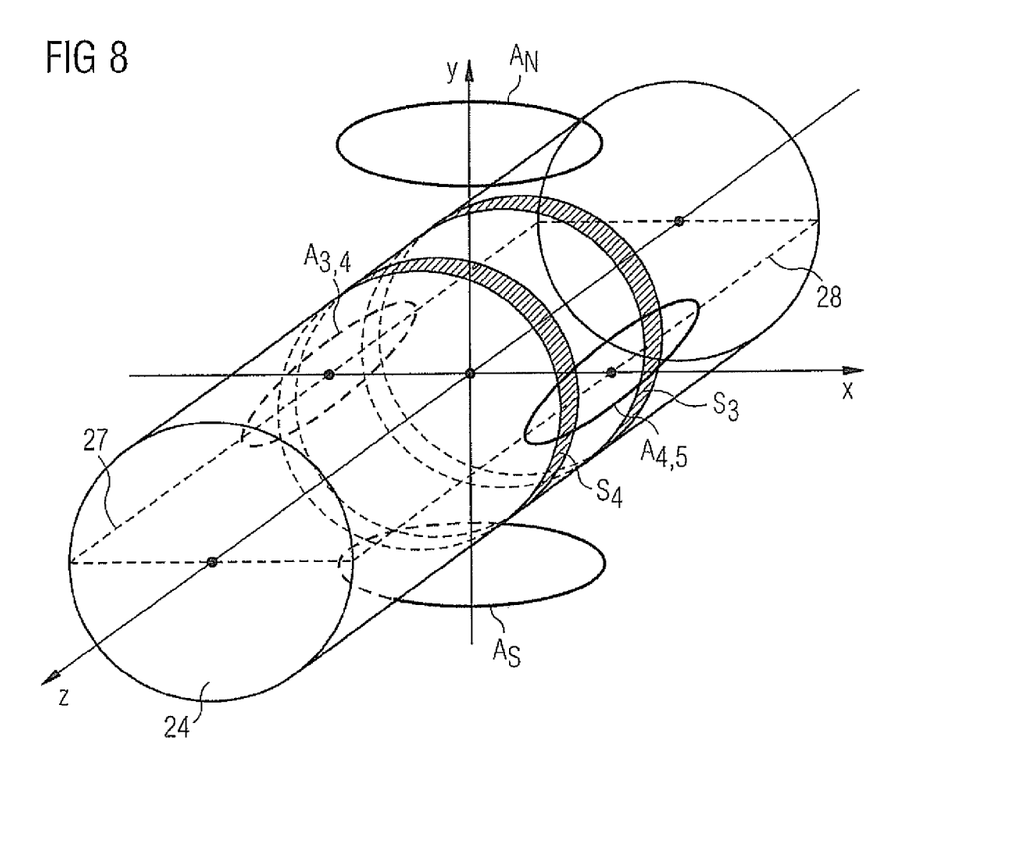
FIG. 8 shows the arrangement of FIG. 7 in perspective from a different viewing angle.

The embodiment shown in FIG. 7 is presented again in FIG. 8 in perspective and from a different viewing angle. It is apparent that the four RE reception antennas surround the volume segment 24, wherein an angle interval between the middle points of two adjacent RF reception antennas respectively amounts to approximately 90°.

It is noted that, in the embodiment presented in FIGS. 7 and 8, only those RF reception antennas which are located at a defined (the same) z-coordinate are shown. Naturally, four additional RE reception antennas are located at other z-coordinates, such that all slices of the volume segment 24 can be acquired simultaneously.

Figure 9:
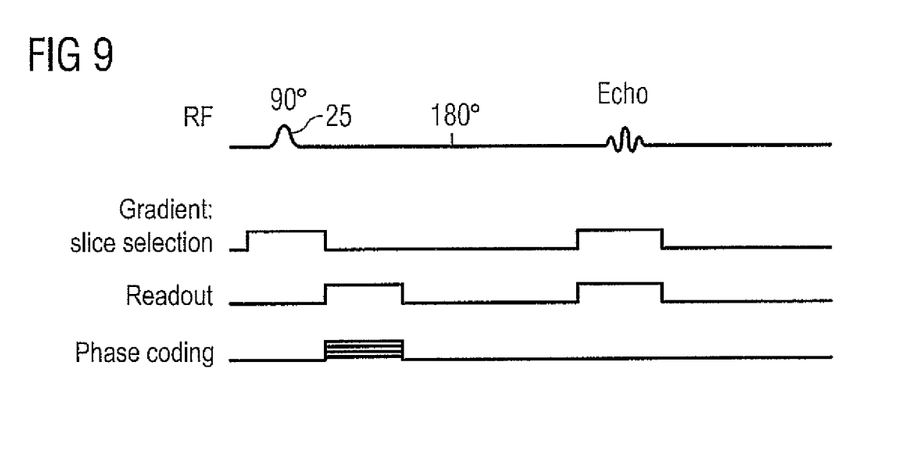
FIG. 9 illustrates a spin echo sequence according to the invention.

A spin echo sequence according to the invention is shown in FIG. 9. This sequence according to the invention also differs from a spin echo sequence known according to the prior art in that not only the readout gradient $G_x$ but also the slice selection gradient $G_z$ is active during the readout phase.

Figure 10:
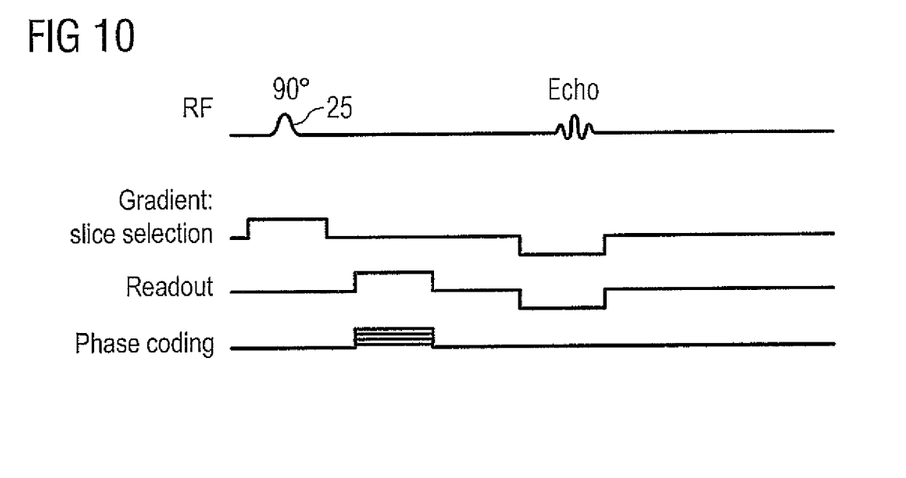
FIG. 10 illustrates a gradient echo sequence according to the invention.

A gradient echo sequence according to the invention is similarly shown in FIG. 10. This gradient echo sequence according to the invention also differs from a gradient echo sequence known according to the prior art in that the slice selection gradient $G_z$ is also activated in addition to the readout gradient $G_x$ during the readout phase.

Figure 11:
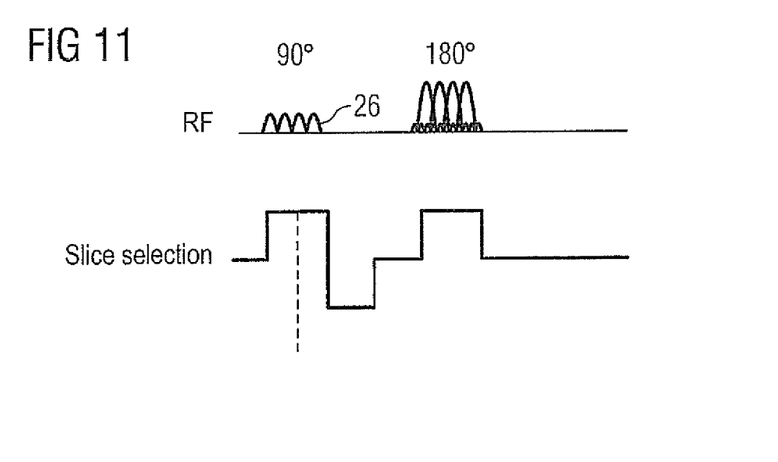
FIG. 11 illustrates a spin echo sequence according to the invention that operates with multiple RF excitation pulses and with multiple refocusing 180° RF pulses.

A sequence according to the invention for parallel excitation of multiple slices is also shown in FIG. 11. During the time period in which the slice selection gradient $G_z$ is applied, multiple 90° RF pulses are switched in order to excite the multiple slices. Each of these multiple 90° RF pulses has a different frequency in order to thus selectively excite different slices of the predetermined volume segment. Each of the 90° RF pulses essentially has the signal form sin(x)/x, so each RF pulse has a peak value. The envelope of these multiple 90° RF pulses accordingly has multiple peaks (one for each RF pulse) that are temporally offset. The amplitude curve of the slice selection gradient $G_z$ is essentially constant, as is shown in FIG. 11.

The advantage of the sequence shown in FIG. 11 (which is also known from U.S. Pat. No. 5,422,572) is that the load of the power amplifier of the magnetic resonance system as well as the maximum radiation exposure of the patient turn out to be lower than when all slices to be excited are excited with one RF excitation pulse.

According to the invention, other sequences or acceleration methods can also be combined with the method according to the invention. Belonging among these are for example:
SMASH ("Simultaneous Acquisition of Spatial Harmonics")
SENSE ("Sensitivity Encoding")
half Fourier (also known as partial Fourier imaging). k-space is thereby scanned asymmetrically.
BRISK ("Block Regional Interpolation Scheme for K space")
TRICKS ("Time Resolved Imaging of Contrast Kinetics")
PICCS ("Prior Image Constrained Compressed Sensing")
HYPR ("HighlY constrained back-PRojection")
compressed scanning ("compressed sensing")
PatLoc: a parallel imaging in which local gradients are used
O-space (see WO 2010068299A1)

Figure 12:
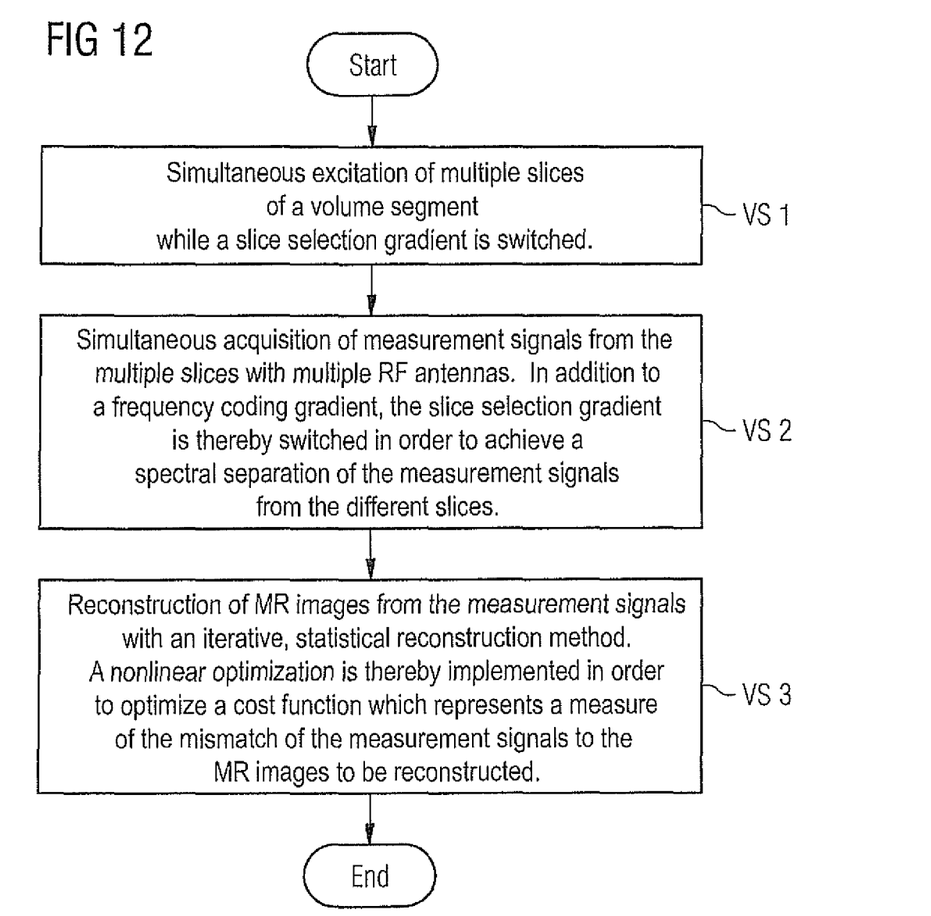
FIG. 12 is a flowchart of an embodiment of the method according to the invention.

A flow chart of the method according to the invention is shown in FIG. 12.

Multiple slices of a predetermined volume segment (the heart, for example) are excited simultaneously in VS 1 while at the same time a slice selection gradient $G_z$ is switched.

In the following Step VS 2 the slices excited in Step VS 1 are acquired simultaneously with multiple RE antennas. During this readout of the measurement signals the slice selection gradient $G_z$ is switched in addition to a frequency coding gradient $G_x$, whereby a partial spectral separation of the measurement signals is achieved.

By the switching of the slice selection gradient Gz during the readout it is advantageously ensured that the frequencies with which the spins of one of the multiple slices precess shift relative to the frequencies of a slice adjacent to this slice. The measurement signals of the one slice are thereby spectrally separated from the measurement signals of the adjacent slice.

Moreover, the measurement signals of the different slices are acquired by RF reception antennas which are optimally arranged close to those slices whose measurement signals the respective RF reception antenna has to receive. The present invention therefore advantageously combines the spectral separation of the measurement signals of adjacent slices (by means of the slice selection gradient $G_z$ switched during the readout) with the spatial separation of the measurement signals of adjacent slices (by means of the spatially separated RF reception antennas).

In the last Step VS 3, MR images are reconstructed from the measurement signals. An iterative statistical reconstruction method is thereby used which implements a nonlinear optimization, wherein a cost function is optimized which indicates a measure of a mismatch of the measurement signals to the MR images to be reconstructed.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate magnetic resonance image data representing a predetermined volume segment of an examination subject, comprising:

operating a magnetic resonance data acquisition unit, in which an examination is located, to simultaneously excite multiple slices of a volume segment of the subject by radiating at least one RF excitation pulse and activating a slice selection gradient during excitation of the multiple slices;

operating said magnetic resonance data acquisition unit to acquire magnetic resonance signals from the multiple slices, arising as a result of the excitation of the multiple slices, with multiple RF reception antennas, at least some of said multiple RF reception antennas being spaced along a propagation direction of said slice selection gradient and, during acquisition of said magnetic resonance signals, activating said slice selection gradient to spectrally separate magnetic resonance signals respectively acquired from different slices among said multiple slices with respective frequency bands of adjacent slices partially overlapping; and in a processor, generating magnetic resonance image data, in a data file available at an output of the processor, from said magnetic resonance signals.

2. A method as claimed in claim 1 comprising operating said magnetic resonance data acquisition unit to activate a frequency coding gradient simultaneously with said slice selection gradient.

3. A method as claimed in claim 2 comprising arranging at least one first antenna, among said multiple RF reception antennas, in said magnetic resonance data acquisition unit at a first side of said volume segment, and arranging at least one second antenna, among said multiple RF reception antennas, in said data acquisition unit at a second side of said volume segment, said first side of said volume segment being parallel to said second side of said volume segment and a surface normal of said first side and a surface normal of said second side being parallel to a propagation direction of said frequency coding gradient.

4. A method as claimed in claim 3 wherein said first and second sides of said volume segment define, for each of said multiple slices, a first slice half that is closest to said first side of said volume segment and a second slice half that is closest to said second side of said volume segment, and comprising tuning said at least one first antenna to a frequency band comprising frequencies of spins excited by said at least one RF excitation pulse in said first half of each slice during said acquisition of magnetic resonance signals, and tuning said at least one second antenna to a frequency band that comprises frequencies of spins excited by said at least one RF excitation pulse in the second half of each of said multiple slices, during said acquisition of said magnetic resonance signals.

5. A method as claimed in claim 4 comprising:
during said acquisition of said magnetic resonance signals, activating a phase coding gradient;
entering the acquired magnetic resonance signals as a data set in a memory representing k-space;
arranging at least one third antenna, among said multiple RF reception antennas, at a third side of said volume segment in said magnetic resonance data acquisition unit, and arranging at least one fourth antenna, among said multiple RF reception antennas, at a fourth side of the volume segment in said magnetic resonance data acquisition unit, said third side being parallel to said fourth side, and a surface normal of said third side and a surface normal of said fourth side being parallel to a propagation direction of said phase coding gradient; and
acquiring said magnetic resonance signals using an accelerated parallel readout procedure in which less than an entire data set in k-space is acquired in the propagation direction of the phase coding gradient.

6. A method as claimed in claim 1 comprising arranging said multiple RF reception antennas parallel to each other in said magnetic resonance data acquisition unit.

7. A method as claimed in claim 1 wherein respective antennas in said multiple RF reception antennas are located in said magnetic resonance data acquisition unit at respective locations corresponding to respective locations of said multiple slices in said volume segment, and tuning each of the respective antennas to a frequency band that comprises frequencies of spins excited in the correspondingly located slice by said at least one RF excitation pulse.

8. A method as claimed in claim 1 comprising:
reconstructing said magnetic resonance image data from said magnetic resonance signals using an iterative, statistical reconstruction algorithm; and
in said iterative, statistical reconstruction algorithm, implementing a non-linear optimization of data represented by said magnetic resonance signals to minimize a cost function representing a degree of mismatch of said magnetic resonance signals to the MR image data to be reconstructed.

9. A method as claimed in claim 1 comprising simultaneously exciting said multiple slices with a modified RF signal form combined with a signal form of said slice selection gradient, which changes over time to decrease radiation exposure of the predetermined volume segment without altering an excitation profile of said multiple slices.

10. A method as claimed in claim 1 comprising emitting said at least one RF excitation pulse as a pulse bundle, with each pulse in said pulse bundle exciting one of said multiple slices.

11. A method as claimed in claim 1 comprising operating said magnetic resonance data acquisition unit to excite a segment of a heart of the examination subject as said volume segment.

12. A magnetic resonance system to generate magnetic resonance image data of a predetermined volume segment of an examination subject, comprising:
a magnetic resonance data acquisition unit comprising multiple RF reception antennas;
a control unit configured to operate the magnetic resonance data acquisition unit, in which an examination is located, to simultaneously excite multiple slices of a volume segment of the subject by radiating at least one RF excitation pulse and activating a slice selection gradient during excitation of the multiple slices;
said control unit being configured to operate said magnetic resonance data acquisition unit to acquire magnetic resonance signals from the multiple slices, arising as a result of the excitation of the multiple slices, with said multiple RF reception antennas, with at least some of said multiple RF reception antennas being spaced along a propagation direction of said slice selection gradient and, during acquisition of said magnetic resonance signals, and activating said slice selection gradient to spectrally separate magnetic resonance signals respectively acquired from different slices among said multiple slices with respective frequency bands of adjacent slices partially overlapping; and a processor configured to generate magnetic resonance image data, in a data file available at an output of the processor, from said magnetic resonance signals.

* * * * *